United States Patent [19]

Agostino et al.

[11] Patent Number: 4,735,820

[45] Date of Patent: Apr. 5, 1988

[54] REMOVAL OF RESIDUAL CATALYST FROM A DIELECTRIC SUBSTRATE

[75] Inventors: Peter A. Agostino, Canaan; Suryadevara V. Babu, Potsdam; Joseph G. Hoffarth, Binghamton, all of N.Y.

[73] Assignee: International Business Machines Corporation, Armonk, N.Y.

[21] Appl. No.: 50,433

[22] Filed: May 18, 1987

[51] Int. Cl.$^4$ .............................................. G03C 5/00
[52] U.S. Cl. ................................... 427/38; 427/98
[58] Field of Search ................. 427/38, 39, 40, 98

[56] References Cited

U.S. PATENT DOCUMENTS

| | | | |
|---|---|---|---|
| 4,214,966 | 7/1980 | Mahoney | 427/38 |
| 4,357,369 | 11/1982 | Kilichowski et al. | 427/38 |
| 4,545,851 | 10/1985 | Takada | 427/38 |
| 4,568,562 | 2/1986 | Phillips | 427/40 |
| 4,585,668 | 4/1986 | Asmussen et al. | 427/38 |
| 4,610,910 | 9/1986 | Kawamoto et al. | 427/98 |

*Primary Examiner*—John H. Newsome
*Attorney, Agent, or Firm*—Pollock, Vande Sande & Priddy

[57] ABSTRACT

Residual catalyst is removed from a dielectric substrate by exposing the substrate to a plasma formed from an inert gas.

12 Claims, No Drawings

REMOVAL OF RESIDUAL CATALYST FROM A DIELECTRIC SUBSTRATE

DESCRIPTION

1. Technical Field

The present invention is concerned with the removal of residual catalyst particles from a dielectric substrate. The present invention is especially concerned with removal of residual catalyst particles from a dielectric substrate after desired circuitry has been provided on the dielectric substrate. The process of the present invention is especially advantageous for removal of residual palladium/tin catalytic particles from the surface of a dielectric substrate. The present invention finds particular applicability in the manufacture of printed circuit cards and boards.

2. Background Art

In the manufacture of printed circuit cards and boards, a dielectric sheet material is employed as the substrate. A conductive circuit pattern is provided on one or both of the major surfaces of the substrate.

A conductive pattern can be formed on the surface of the substrate using a variety of known techniques. These known techniques include the subtractive technique where a layer of the metal, such as copper, is etched to form the desired circuit pattern, an electroless deposition technique where a metal, particularly copper, is electrolessly plated directly on the surface of the substrate in the desired pattern and the peel-apart technique where the desired circuit pattern is plated up from a thin layer of peel-apart metal, especially copper.

If it is desired to use such an electroless deposition, it is necessary to plate directly on the surface of the substrate. Since the dielectric substrate is non-conductive, in order to plate on the substrate, the substrate must be catalyzed or seeded prior to the deposition of metal onto the substrate. The seeder, in addition to coating the substrate, also coats the walls of holes or vias that might be present in the substrate.

Moreover, in order to provide patterned metal surfaces on the substrate, a resist material is applied above the catalyst or seeder. The resist can be applied, for instance, by laminating a dry film of the resist to the substrate. The layer of resist material is then selectively exposed to the desired pattern by a known lithographic technique using actinic light, such as ultraviolet light, followed by removal of the exposed portions in the case of positive-resist materials and unexposed portions in the case of negative-resist materials, by etching or dissolution in an appropriate liquid. Next, the surface is plated with a metal which is deposited on those areas of the surface which are not protected by the patterned resist. When an appropriate thickness of metal has been deposited, the resist may be removed, leaving behind a patterned metal conductive surface.

One problem that can occur with the above procedure is that catalyst or seeder particles can remain on unplated portions of the substrate after the plating process and after stripping of the photoresist material. The presence of such particles can, in turn, result in a decrease in the insulation resistance between adjacent conductive lines. The presence of such particles is detrimental to the long term reliability of the printed circuit.

DISCLOSURE OF INVENTION

The present invention is concerned with a process for removing residual catalytic particles from at least one major surface of a dielectric substrate. In addition, the present invention is concerned with removal of residual catalytic particles from at least one major surface of a dielectric substrate without removing portions of the substrate and/or removal of the metal plated thereon.

In particular, the process of the present invention comprises exposing the substrate having the residual catalytic particles thereon to a plasma. The plasma employed is one formed from an inert gas.

BEST AND VARIOUS MODES FOR CARRYING OUT INVENTION

In accordance with the present invention, residual catalyst is removed from a dielectric substrate by exposing the substrate to a plasma formed from an inert gas. The inert gas is preferably argon, or krypton, and most preferably argon.

The process of the present invention is applicable to removal of residual catalyst particles from a wide variety of dielectric (non-conductor) substrates including thermoplastic polymers, quartz, and glass, and particularly, thermosetting resins.

Typical thermosetting polymeric materials include epoxy, phenolic-based materials, and polyimides. Such materials are usually molded of the resinous material along with a reinforcing agent such as a glass-filled epoxy or phenolic-based material. Examples of some phenolic-type materials include copolymers of phenol, resorcinol, and cresol. Typical thermoplastic polymers are the polymeric fluorocarbons.

The preferred polymeric materials employed are epoxy resinous materials. Typical epoxy resins include the bisphenol A type resins obtained from bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane and alicyclic epoxy resins such as bis(3,4-epoxy-6-methylcyclohexyl methyl) adipate. The most preferred epoxy employed is of the bisphenol A type.

The epoxy resinous compositions also can contain accelerating agents and curing agents as well-known in the art. Examples of suitable curing agents include polyamines, primary, secondary, and tertiary amines, polyamides, polysulfides, urea-phenol-formaldehyde, and acids or anhydrides thereof. In addition, suitable curing agents include Lewis acid catalysts such as $BF_3$ and complexes thereof. Many of the dielectric substrates are referred to as so-called prepreg substrates which contain a resin and a reinforcing fiber such as fiberglass. Such compositions containing fibers are usually prepared by impregnating the fibers with, for instance, an epoxy polymer composition. The amount of the epoxy composition is usually about 30% to about 70% by weight and preferably about 50% to about 65% by weight of the total solid content of the epoxy composition of the fiberglass.

After combining with the resinous fibers the composition is cured to the B stage and molded to the desired shape, such as a sheet. When sheets are employed the thickness is usually about 1.5 mils to about 8 mils. The curing of the B stage is generally achieved by using temperatures of about 80° C. to about 110° C. for about 3 minutes to about 10 minutes.

The substrate can then be laminated onto another supporting substrate as is generally practiced. For instance, the bonding of substrates can be carried out by pressing together a number of sheets of the substrate in a preheated laminating press at a predetermined pressure and temperature as, for example, about 200 psi to about 500 psi and more usually about 250 psi to about 300 psi and at about 180° C. The time of the pressing operation is variable, depending upon the particular materials employed and the pressures applied. Usually about 1 hour is adequate for the above conditions.

If desired, holes or vias can be provided in the circuit board followed by suitable cleaning of the holes and then preconditioning of the substrate. For instance, preconditioning can include creation of active sites by physical means such as the sacrificial metal technique, sand, and/or vapor blasting, and/or chemical means such as solvent swelling. A typical solvent is N-methyl pyrrolidone.

The surfaces of the dielectric substrate that are to be coated with a metal, including the holes or vias if present, must be made catalytic for the deposition of the metal thereon. For instance, a suitable catalyst is deposited on the desired surfaces of the dielectric substrate as well as in the holes or vias prior to contact with an electroless plating bath.

Among the more widely employed procedures for catalyzing or seeding a substrate is the use of a stannous chloride sensitizing solution and a palladium chloride activator to form a layer of metallic palladium particles. For instance, one method for catalyzing a dielectric substrate is exemplified by U.S. Pat. No. 3,011,920 which includes sensitizing the substrate by treating it with a solution of colloidal metal, accelerating the treatment with a selective solvent to remove protective colloids from the sensitized dielectric substrate, and then electrolessly depositing the metal onto the sensitized substrate.

Also, as suggested, for example, in U.S. Pat. No. 3,099,608, a dielectric substrate can be pretreated by depositing a thin layer of "conductivator" type metal particles, such as palladium metal, from a semicolloidal solution onto the dielectric substrate to provide a conducting base which permits plating with a conductive metal on the "conductivated" base.

Moreover, U.S. Pat. No. 3,632,388 suggests a method for treating a polymeric plastic substrate in the plating process which utilizes a preliminary chromic acid etch followed by a one-step activation with a tin-palladium hydrosol.

More recently, U.S. Pat. No. 4,066,809 discloses the use of a so-called triple seeding technique. This technique includes contacting the surfaces of the dielectric substrate first with a stannous chloride sensitizing solution, then with a palladium chloride activator, and then with a palladium chloride/stannous chloride/hydrochloric acid seeder bath.

In addition, prior to the stannous chloride and palladium chloride treatment, the substrate and through-holes can be treated with an aqueous solution containing a multi-functional ionic polymer, as described in U.S. Pat. No. 4,478,883 to Bupp, et al. and U.S. Pat. No. 4,554,182 to Bupp, et al., disclosures of which are incorporated herein by reference.

The polymers are multi-functional ionic materials in that they contain at least two active or available ionic functional moieties of the same polarity. The polymers are at least water miscible and are preferably water soluble or at least soluble in the water compositions employed. The more usual ionic moieties are cationic moieties such as quaternary phosphonium and quaternary ammonium groups. Polymers containing at least two ionic moieties are commercially available. Examples of commercially available multi-functional cationic polymers are Reten 210, Reten 220, and Reten 300, available from Hercules, disclosures of which can be found in "Water Soluble Polymers", Bulletin VC-482A, Hercules Incorporated, Wilmington, Del. 19899, disclosure of which is incorporated herein by reference. The Reten polymers are high molecular weight polymers (usually about 50,000 to about 1,000,000 or more) and have a main chemical backbone of polyacrylamide.

The ionic polymer is usually employed as a dilute aqueous solution of about 0.01% to about 1% by weight and more usually about 0.05% to about 0.5% by weight of the copolymer. The aqueous solution usually contains an inorganic acid such as $H_2SO_4$ or HCl to provide a pH of about 0 to about 7 and more usually a pH of about 0 to about 3. The acid is usually present in amounts of about 2% to about 10% by weight.

The treatment with the ionic polymer is generally about 1 minute to about 10 minutes.

After treating with the ionic polymer, if carried out and if desired, the structure can be rinsed such as with deionized water in order to remove any excess polymer not adsorbed.

Next, the dielectric substrate and the holes, if present, are activated by contact with a composition containing a catalytic composition capable of initiating electroless plating thereon. The compositions can contain metal that directly provides the catalytic sites or serve as a precursor which leads to the catalytic sites. The metal present may be in the elemental form, an alloy, or compounds, or mixtures thereof. The preferred metal catalysts are precious metals such as gold, palladium, and platinum.

The most preferred catalyst is palladium. A typical palladium composition contains about 1.2 to about 2.5 grams per liter of a palladium salt which is preferably $PdCl_2$, about 80 to about 150 grams per liter of a stannous salt which is preferably $SnCl_2 \cdot 2H_2O$ and about 100 to about 150 milliliters per liter of an acid which is preferably HCl. When HCl is provided in the form of a 37% HCl solution, about 280 to about 360 milliliters of the HCl solution is generally employed.

The most preferred composition contains about 1.5 grams per liter of $PdCl_2$ and about 280 milliliters per liter of 37% HCl. The composition is usually maintained at a temperature of about 65° F. ±10° F.

A typical triple seeder process is disclosed, for instance, in U.S. Pat. No. 4,525,390 to Alpaugh, et al., disclosure of which is incorporated herein by reference.

The conditioned substrates can be rinsed with deionized water treated with dilute HCl and dried at elevated temperatures prior to plating. In addition to these process steps, photoresist masks corresponding to the negative of the desired metal patterns are formed on the activated surfaces prior to plating, or photoresist corresponding to the desired pattern by employing a positive photoresist may be formed on the activated surfaces prior to plating. The resist can be applied, for instance, by lamination such as a hot roll lamination at temperatures of about 90° C. to about 120° C. and more usually about 110° C.; and pressures of about 5 to about 30 psi and more usually about 10 to about 15 psi. The photoresist is then selectively imaged to the desired pattern by well-known lithographic techniques, such as using ultraviolet light, followed by removal of the exposed portions in the case of positive photoresist materials by etching or dissolution in an appropriate liquid. In the case of negative resist materials, the unexposed portions are removed.

Examples of some negative or photohardenable photoresists are disclosed in U.S. Pat. Nos. 3,469,982; 3,526,504; 3,867,153; and 3,448,098; and published European Patent Application No. 0049504, disclosures of which are incorporated herein by reference. Polymers from methylmethacrylate and from glycidyl acrylate and/or from a polyacrylate such as trimethylol propane triacrylate and pentaerythritol triacrylate are commercially available from E. I. Du Pont de Nemours and Company under the trade designation "Riston". An example of another type of photoresist is based on phenol formaldehyde novolak polymers. A particular example of such is Shipley AZ1350 which is an m-cresol formaldehyde novolak polymer composition. Such is a positive resist composition and includes therein a diazo ketone such as 2-diazo-1-naphthol-5-sulphonic acid ester.

Next, the conditioned substrates are coated with an electrically conductive metal such as copper or nickel by contacting the structure with an electroless plating bath. The preferred metal employed is copper. Suitable copper electroless plating baths and their method of application are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjustor. The plating baths also can contain a cyanide ion source and a surface-active agent.

The cupric ion source generally used is a cupric sulfate or a cupric salt of the. complexing agent to be employed. When employing cupric sulfate, it is preferred to use amounts from about 3 to about 15 grams per liter and most preferably from about 8 to about 12 grams per liter. The most common reducing agent employed is formaldehyde which is generally in amounts from about 0.7 to about 7 grams per liter and more usually about 0.7 to about 2.2 grams per liter. Examples of some other reducing agents include formaldehyde precursors or derivatives such as paraformaldehyde, trioxane, dimethyl hydantoin, and glyoxal; borohydrides such as alkali metal borohydrides (sodium and potassium borohydride) and substituted borohydrides such as sodium trimethoxy borohydride, and boranes such as amine borane, isopropyl amine borane, and morpholine borane. Hypophosphite reducing agents can also be used for an electroless nickel and copper plating. Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono (gamma)-lactone, modified ethylene diamine acetates such as N-hydroxy ethyl ethylene diamine triacetate. A number of other suitable cupric complexing agents are suggested in U.S. Pat. Nos. 2,996,408; 3,075,855; 3,075,856; and 2,938,805.

The amount of complexing agent usually present in a solution is generally from about 20 to about 50 grams per liter or a 3-4 fold molar excess of the cupric ions present.

Moreover, the plating bath generally contains a surfactant that assists in wetting the surfaces to be coated. Satisfactory surfactant is, for instance, an organic phosphate ester available under the trade designation GaFac RE610. Generally, the surfactant is present in amounts from about 0.02 to about 0.3 grams per liter. In addition, the pH of the bath is usually controlled, for instance, by the addition of a basic compound such as sodium hydroxide or potassium hydroxide in the desired amount to achieve the desired pH. The more usual pH of the electroless copper plating baths is usually between about 11.6 and about 11.8.

Furthermore, the plating bath can also include a cyanide ion and most usually about 10 to about 25 milligrams per liter to provide a cyanide ion concentration in the bath within the range of about 0.0002 to about 0.0004 molar. Examples of some cyanides include the alkali metal, alkaline earth metal, and ammonium cyanides. The specific gravity of such plating baths is generally in the range of about 1.060 to about 1.080. Moreover, the temperature of the copper electroless plating baths is usually between about 70° C. and about 80° C. and more usually between about 70° C. and about 75° C. For a discussion of suitable plating temperatures along with cyanide concentration see U.S. Pat. No. 3,844,799.

Also, the oxygen content of the baths can be maintained between about 2 ppm and about 4 ppm and preferably about 2.5 to about 3.5 ppm, as discussed in U.S. Pat. No. 4,152,467. The oxygen content can be controlled by injecting oxygen and an inert gas into the bath. The overall flow rate of the gasses in the bath is generally from 1 to about 20 SCFM per thousand gallons of bath and preferably from 3 to about 8 SCFM per thousand gallons of bath.

Next, the layer of resist is removed from the substrate, leaving the desired conductive pattern on the substrate.

The resist is removed by dissolution in a suitable solvent. For instance, by way of example, when the resist layer is Riston T-168, the exposed material can be removed employing 1,1-dichloromethane.

However, after removal of the resist material, the substrate still contains residual amounts of catalytic particles that were present beneath the resist material. Pursuant to the present invention, such particles are removed without adversely effecting the substrate and the conductive metal thereon, such as by etching or removing portions of the substrate and conductive metal thereon, by exposing the substrate to a plasma that is formed from an inert gas. The gasses from which the plasma is formed, in accordance with the present invention, include argon, and krypton. The preferred gas employed is argon.

Plasma reactors suitable for carrying out the process of the present invention are commercially available and need not be discussed herein in any great detail. Typical commercially available plasma reactors suitable for carrying out the present invention are parallel plate reactors such as from Plasma Therm. The plasma reactor should be operated only in the reactive ion etch mode. That is, with the substrate in direct electric contact with the powered electrode.

In reactive ion etching mode the ions are accelerated towards the substrate since the substrate to be treated is placed on a cathode that is negatively biased relative to an anode, for instance, by means of a radio frequency power supply.

The process of the present invention is generally carried out under vacuum at pressures between about 10 and about 200 millitorr and preferably at least about 20 to about 100 millitorr.

A convenient power density for operating the radio frequency power source is between about 0.1 and about 1 watt per square centimeter, and preferably about 0.3 to about 0.8 watts per square centimeter of the cathode.

A convenient frequency for operating the power supply is between about 10 and 200 kilohertz (KHz), and preferably about 35 and 100 KHz. Of course, significantly different frequencies can be employed, if desired.

The flow rate of the gas employed is generally at least about 30 scc per minute and preferably about 60 to about 100 scc minute.

In addition, the residence time of the gas is usually about 30 seconds or less and preferably about 5 to about 20 seconds.

A typical temperature of the substrate during the treatment is about 80° C. to about 145° C. and preferably about 100° C. to about 125° C.

A typical apparatus size employed is a reactor having about a two foot diameter.

The following non-limiting example is presented to further illustrate the present invention:

EXAMPLE

Substrates of an epoxy-glass fiber laminate having copper conductive lines thereon of about 1.2–1.4 mils in height and about 4 mils wide with about 6–8 mils between lines; and having residual palladium/tin catalyst thereon are placed on the cathode in a parallel plate reactor having a two foot diameter. The substrates are exposed to a plasma from argon gas at a flow rate of about 60 standard cubic centimeters per minute. The pressure employed is about 100 millitorr and the power density is about 0.2 watts/cm$^2$ of the cathode.

Different substrates are exposed to the plasma for 10 minutes, 20 minutes, or 30 minutes. In all cases, the amount of palladium/tin residue is reduced without deleteriously effecting the epoxy-glass laminate or copper lines.

Having thus described our invention, what we claim as new and desire to secure by Letters Patent is:

1. A process for the removal of residual catalyst from a dielectric substrate which comprises exposing said substrate to a plasma formed from an inert gas.

2. The process of claim 1 wherein said inert gas is selected from the group of argon, krypton, and mixtures thereof.

3. The process of claim 1 wherein said inert gas includes argon.

4. The process of claim 1 wherein said catalyst includes palladium/tin.

5. The process of claim 4 wherein said substrate is an epoxy substrate.

6. The process of claim 1 wherein said substrate is an epoxy substrate.

7. The process of claim 1 wherein said substrate includes metal circuit lines thereon.

8. The process of claim 7 wherein said metal is copper.

9. The process of claim 1 wherein said substrate is an epoxy substrate that includes metal circuit lines thereon.

10. The process of claim 9 wherein said metal is copper.

11. The process of claim 9 wherein said catalyst is palladium/tin.

12. The process of claim 11 wherein said inert gas includes argon.

* * * * *